(12) United States Patent
Li et al.

(10) Patent No.: US 9,037,102 B1
(45) Date of Patent: May 19, 2015

(54) METHOD AND APPARATUS FOR ENVELOPE TRACKING

(71) Applicant: Marvell International Ltd., Hamilton (BM)

(72) Inventors: Qiang Li, Austin, TX (US); Brian T. Brunn, Bee Cave, TX (US)

(73) Assignee: MARVELL INTERNATIONAL LTD., Hamilton (BM)

( * ) Notice: Subject to any disclaimer, the term of this patent is extended or adjusted under 35 U.S.C. 154(b) by 79 days.

(21) Appl. No.: 13/938,586

(22) Filed: Jul. 10, 2013

Related U.S. Application Data

(60) Provisional application No. 61/669,909, filed on Jul. 10, 2012.

(51) Int. Cl.
  *H01Q 11/12*   (2006.01)
  *H04B 1/04*   (2006.01)
  *H03K 3/012*   (2006.01)
  *H04B 1/06*   (2006.01)

(52) U.S. Cl.
  CPC . *H04B 1/04* (2013.01); *H03K 3/012* (2013.01)

(58) Field of Classification Search
  CPC .................. H03G 3/004; H03F 2201/3212
  USPC .................. 455/127.1, 127.2; 375/240.21
  See application file for complete search history.

(56) References Cited

U.S. PATENT DOCUMENTS

| | | | | |
|---|---|---|---|---|
| 5,379,242 A | * | 1/1995 | Rose et al. | 708/300 |
| 2009/0045992 A1 | * | 2/2009 | Tracht et al. | 341/61 |

\* cited by examiner

*Primary Examiner* — Lee Nguyen

(57) ABSTRACT

Aspects of the disclosure provide a circuit that includes a first circuit, a second circuit, and an adder. The first circuit is configured to generate a first signal by outputting and holding, at a first timing, a first stream in response to an input stream of data. The second circuit is configured to generate a second signal by outputting and holding, at a second timing, a second stream in response to the input stream of data. The adder is configured to add the first signal with the second signal to generate an up-sampled stream for the input stream of data and reduce a frequency component in the up-sampled stream generated by the up-sampling.

20 Claims, 6 Drawing Sheets

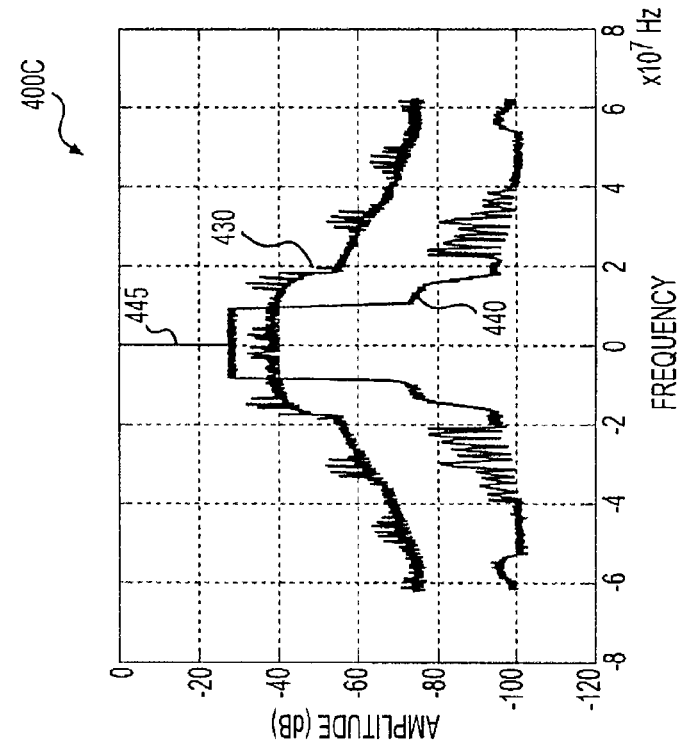
FIG. 4A
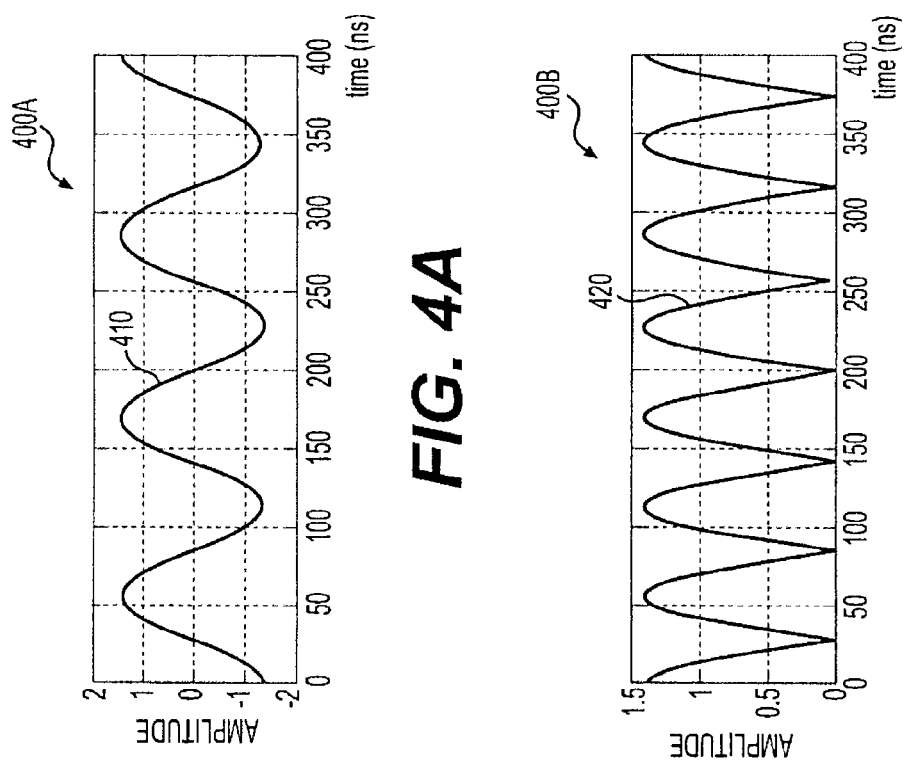
FIG. 4C
FIG. 4B

US 9,037,102 B1

METHOD AND APPARATUS FOR ENVELOPE TRACKING

INCORPORATION BY REFERENCE

This present disclosure claims the benefit of U.S. Provisional Application No. 61/669,909, "Method & Apparatus to Remove Digital Spur in Envelope Tracking" filed on Jul. 10, 2012, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Power supply modulation techniques can be used to reduce power consumption. In an example, a mobile phone uses a power amplifier to amplify a radio frequency signal before transmission. When the power supply to the power amplifier is modulated to track the amplitude of the radio frequency signal, the power consumed by the power amplifier can be reduced.

SUMMARY

Aspects of the disclosure provide a circuit that includes a first circuit, a second circuit, and an adder. The first circuit is configured to generate a first signal by outputting and holding, at a first timing, a first stream in response to an input stream of data. The second circuit is configured to generate a second signal by outputting and holding, at a second timing, a second stream in response to the input stream of data. The adder is configured to add the first signal with the second signal to generate an up-sampled stream for the input stream of data and reduce a frequency component in the up-sampled stream generated by the up-sampling.

In an embodiment, the first circuit is configured to generate the first stream with a first phase shift to the input stream of data, and the second circuit is configured to generate the second stream with a second phase shift to the input stream of data. For example, the second circuit is configured to generate the second stream with an additional 180° phase shift to the first phase shift.

According to an embodiment of the disclosure, the first circuit is configured to generate the first signal by outputting and holding, at rising edges of a clock signal, the first stream in response to the input stream of data, and the second circuit is configured to generate the second signal by outputting and holding, at falling edges of the clock signal, the second stream in response to the input stream of data.

According to an aspect of the disclosure, the input stream is a stream of envelope values for a transmission signal, and the up-sampled stream is used to generate an output signal to modulate a supply voltage to a power amplifier that amplifies the transmission signal. In an example, the circuit includes a third circuit configured to generate the transmission signal in a radio frequency band. Further, the circuit includes a plurality of circuits configured to phase-shift the input stream by different phases. The first circuit and second circuit are selected from the plurality of circuits to align the supply voltage adjustment with the generation of the transmission signal.

Aspects of the disclosure provide a method. The method includes generating a first signal by outputting and holding, at a first timing, a first stream in response to an input stream of data, generating a second signal by outputting and holding, at a second timing, a second stream in response to the input stream, and adding the first signal with the second signal to generate an up-sampled stream for the input stream of data and reduce a frequency component in the up-sampled stream that is generated by the up-sampling.

Aspects of the disclosure provide an apparatus that includes an envelope processing circuit and a voltage modulator. The envelope processing circuit includes a first circuit, a second circuit, and an adder. The first circuit is configured to generate a first signal by outputting and holding, at a first timing, a first stream in response to an input stream of envelopes values for a transmission signal. The second circuit is configured to generate a second signal by outputting and holding, at a second timing, a second stream in response to the input stream. The adder is configured to add the first signal with the second signal to generate an up-sampled stream for the input stream and reduce a frequency component in the up-sampled stream generated by the up-sampling. The voltage modulator is configured to modulate a supply voltage to an amplifier that amplifies the transmission signal based on the up-sampled stream.

BRIEF DESCRIPTION OF THE DRAWINGS

Various embodiments of this disclosure that are proposed as examples will be described in detail with reference to the following figures, wherein like numerals reference like elements, and wherein:

FIGS. 4A-4C show plots for envelope tracking according to an embodiment of the disclosure;

DETAILED DESCRIPTION OF EMBODIMENTS

Figure 1:
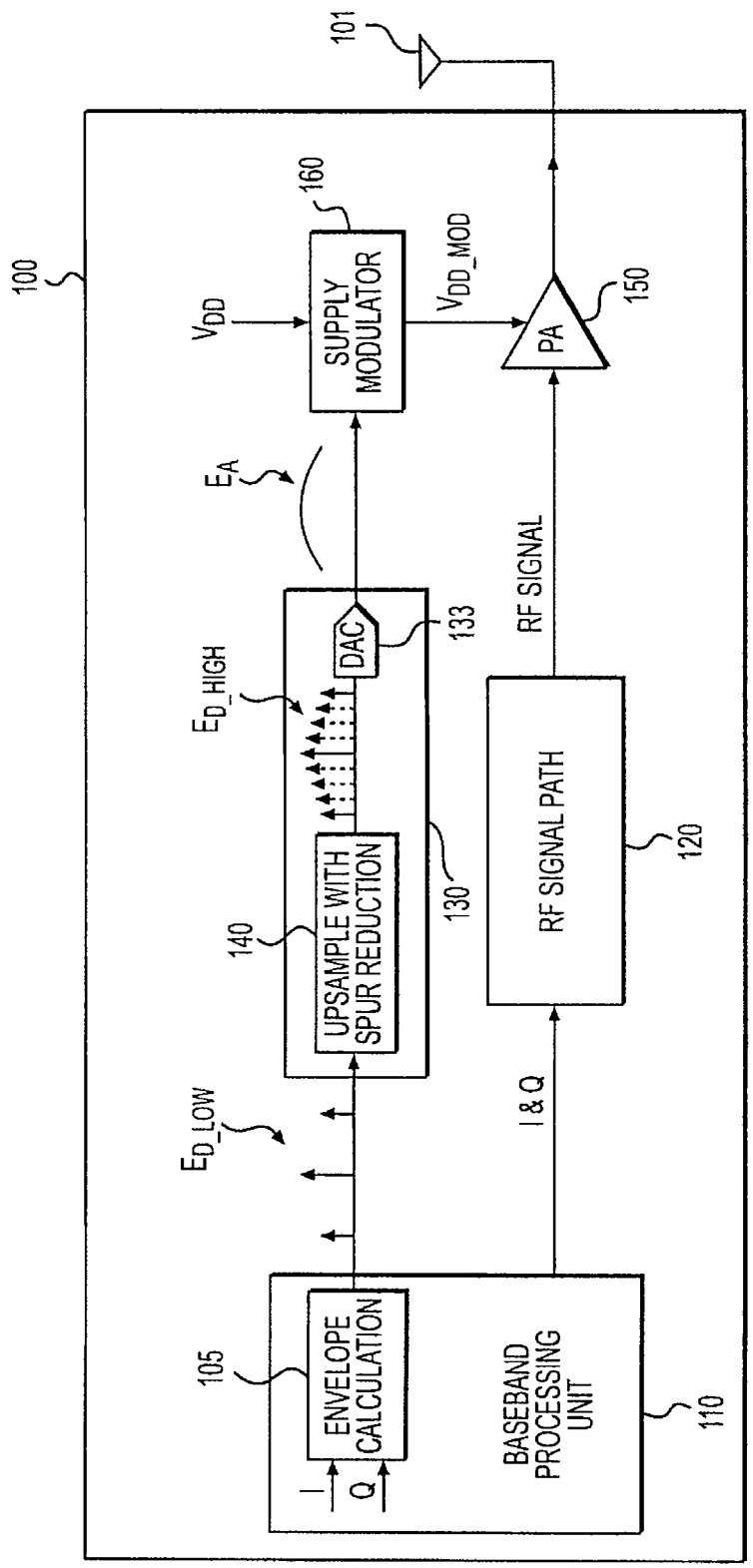
FIG. 1 shows a block diagram of a wireless device example 100 according to an embodiment of the disclosure.

FIG. 1 shows a block diagram of a wireless device example 100 according to an embodiment of the disclosure. The wireless device 100 includes a baseband processing unit 110, a radio frequency (RF) signal path 120, an envelope path 130, a power amplifier (PA) 150, a supply modulator 160, and an antenna 101. These elements are coupled together as shown in FIG. 1.

The wireless device 100 can be any suitable device, such as a cell phone, a smart phone, a laptop, a tablet, a printing device, an imaging device, a mobile device, a remote controlling device, and the like, that uses electromagnetic waves in the air for wireless communication. The wireless communication can comply with any suitable technology and standard, such as Wi-Fi technology, cellular radio technology, Bluetooth technology, and the like. In an embodiment, the wireless device 100 is a mobile phone that complies with a long-term evolution (LTE) standard for wireless communication of high speed data.

In the FIG. 1 example, the wireless device 100 uses power supply modulation technique to reduce power consumption.

Specifically, in an example, the baseband processing unit 110 processes data for transmission in baseband, such as in the form of an in-phase component (I) and a quadrature component (Q) of the data for transmission. In addition, the baseband processing unit 110 has an envelope tracking capability to track an envelope of the data for transmission. In the FIG. 1 example, the baseband processing unit 110 includes an envelope calculation unit 105 configured to generate a stream of digital values $E_{D\_LOW}$ based on the in-phase component and the quadrature component to track the envelope of the data for transmission. It is noted that the envelope of the data for transmission can be tracked by other suitable technique.

Further, the data for transmission (e.g., a stream of I and Q values) and the envelope of the data for transmission (e.g., the stream of digital values $E_{D\_LOW}$) are processed along respective processing paths for respective processing. For example, the RF signal path 120 includes any suitable circuits to generate an RF signal in a radio frequency band to carry the data for transmission. The envelope path 130 generates an analog modulation signal $E_A$ based on the stream of digital values $E_{D\_LOW}$. The supply modulator 160 modulates a supply voltage $V_{DD\_MOD}$ based on the analog modulation signal $E_A$. The modulated supply voltage $V_{DD\_MOD}$ is provided to the power amplifier 150 as the supply voltage. The power amplifier 150 then amplifies the RF signal, and the amplified RF signal is transmitted as electromagnetic waves in the air by the antenna 101. When the modulated supply voltage $V_{DD\_MOD}$ is aligned with the RF signal, a voltage drop on the power amplifier 150 (e.g., output transistors in the power amplifier 150) is reduced. Thus, the amount of power wasted by the power amplifier 150 is reduced and the power amplifier 150 dissipates less heat.

According to an aspect of the disclosure, noise in the modulated supply voltage $V_{DD\_MOD}$ can be coupled to the amplified RF signal, and thus can affect signal quality. Thus, in an embodiment, the envelope path 130 is configured to generate the analog modulation signal $E_A$ with a reduced noise level.

Specifically, the envelope path 130 includes an up-sample module 140 with a spur reduction configuration and a digital to analog converter (DAC) 133 having a relatively large sample rate. According to an embodiment of the disclosure, the relatively large sample rate can reduce noise level in the analog modulation signal $E_A$. In an embodiment, the sample rate of the DAC 133 is larger than the sample rate of the stream of digital values $E_{D\_LOW}$. In an example, to reduce complexity, the envelope of the data for transmission (the stream of digital values $E_{D\_LOW}$) is calculated at a relatively low sample rate, such as 62.4 MHz. The up-sample module 140 up-samples the stream of digital values $E_{D\_LOW}$ to generate an up-sampled stream of digital values $E_{D\_HIGH}$. In an example, the up-sampled stream of digital values $E_{D\_HIGH}$ has a sample rate that is four times of the relatively low sample rate, such as 249.6 MHz (four times of 62.4 MHz). Then, the DAC 133 converts the up-sampled stream of digital values $E_{D\_HIGH}$ into the analog modulation signal $E_A$.

According to an aspect of the disclosure, the envelope of the data for transmission $E_{D\_LOW}$ has a non-zero DC level, and the DC level can be relatively high, such as about 30 dB above baseband signal spectrum. The non-zero DC level can cause spurs at image frequencies when the stream of digital values $E_{D\_LOW}$ is up-sampled. For example, the stream of digital values $E_{D\_LOW}$ has a sample rate of 62.4 MHz and is up-sampled by two to double the sample rate, and the up-sampling can cause a spur at 62.4 MHz. In the FIG. 1 example, the up-sample module 140 is in a spur reduction configuration to perform spur reduction to reduce spurs at the image frequencies, such as at 62.4 MHz, 124.8 MHz and the like.

In an embodiment, the up-sample module 140 includes a poly-phase filter (not shown) configured to align the delay of the envelope path 130 with regard to the delay on the RF signal path 120, thus the modulated supply voltage $V_{DD\_MOD}$ can be aligned with the RF signal. The poly-phase filter is modified and is used to perform up-sampling and spur reduction without adding significant delay and complexity.

It is noted that the wireless device 100 can include other suitable components (not shown), such as a receiving circuit, and the like.

It is also noted that the components in the wireless device 100 can be implemented on one or more integrated circuit (IC) chips. In an example, the baseband processing circuit 110, the envelope path 130 and the RF signal path 120 are implemented on an IC chip, and the supply modulator 160 and the power amplifier 150 are external to the IC chip. The IC chip, the supply modulator 160 and the power amplifier 150 can be assembled on a printed circuit board. In another example, the baseband processing circuit 110, the envelope path 130, the RF signal path 120, the supply modulator 160 and the power amplifier 150 are integrated on the same IC chip.

Figure 2:
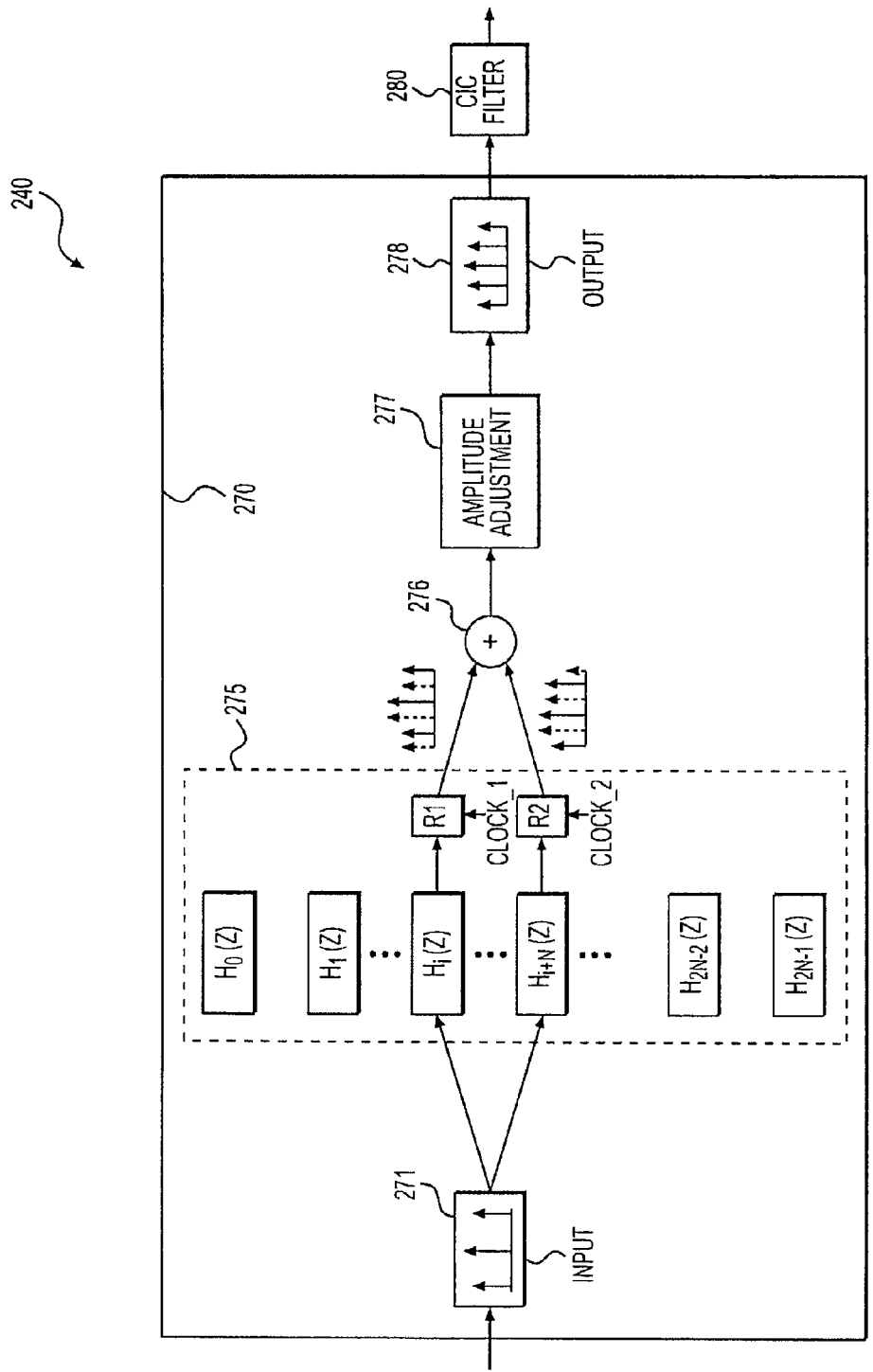
FIG. 2 shows a block diagram of an up-sample module example 240 according to an embodiment of the disclosure.

FIG. 2 shows a block diagram of an up-sample module example 240 according to an embodiment of the disclosure. The up-sample module 240 can be used as the up-sample module 140 in FIG. 1. The up-sample module 240 includes multiple stages, such as a first stage 270, a second stage 280, and the like. In the FIG. 2 example, the first stage 270 is a poly-phase filter bused stage that up-samples by two to double the sample rate, and the second stage 280 is a cascaded integrator-comb (CIC) filter based stage that up-samples by two to further double the sample rate. Thus, the up-sample module 240 up-samples an in-coming stream by four times to generate an output stream.

In the FIG. 2 example, the first stage 270 includes an input node 271, a poly-phase filter 275, an adder 276, an amplitude adjustment module 277 and an output node 278. These elements are coupled together as shown in FIG. 2.

The input node 271 includes suitable circuit to receive an input stream of values coming into the first stage 270. The input stream of values has a first sample rate, such as 62.4 MHz. The poly-phase filter 275 includes a plurality of phase filters with respective phase shifts. In the FIG. 2 example, the poly-phase filter 275 includes 2N phase filters $H_0(Z)$ to $H_{2N-1}(Z)$ (N is a positive integer). In an example, each filter $H_i(Z)$ (i is the index number) is configured to filter the input stream and phase-shift the input stream by $360 \times i/2N$.

In an embodiment, the poly-phase filter 275 is a sine shape filter that has 36 phases (N is 18), and the poly-phase filter 275 includes 36 phase filters $H_0(Z)$ to $H_{35}(Z)$. In an example, each phase filter is implemented as a six-tap finite-impulse response (FIR) filter, and thus the poly-phase filter 275 has a total of 216 filter coefficients that can be stored in registers for example. Each phase filter can be implemented using six multipliers (not shown) and several adders (not shown). In each phase filter, the filter coefficients are determined to filter the input stream and phase-shift the input stream with different phases. For example, filter coefficients in $H_0(Z)$ are determined to shift the input stream by a phase shift of 0°, filter coefficients in $H_1(Z)$ are determined to shift the input stream by a phase shift of 10°, filter coefficients in $H_2(Z)$ are determined to shift the input stream by a phase shift of 20°, so forth, and filter coefficients in $H_{35}(Z)$ are determined to shift the input stream by a phase shift of 350°.

Further, according to an embodiment of the disclosure, results from two or more phase filters are added together to reduce spurs at specific frequencies. In the FIG. 2 example, results from two phase-filters with 180° phase difference are added together to reduce a spur at an image frequency caused by the non-zero DC level and the up-sampling. Specifically, in an example, the phase filter $H_i(Z)$ is selected according to a target path for phase-alignment, such as the RF signal path 120 in FIG. 1. The phase filter $H_{i+N}(Z)$ is selected to have 180° phase difference to the phase filter $H_i(Z)$. Each of the phase filters $H_i(Z)$ and $H_{i+N}(Z)$ receives the input stream from the input node 271 and generates a filtered stream based on their respective filter coefficients.

In addition, the filtered streams from the phase filters $H_i(Z)$ and $H_{i+N}(Z)$ are output at different timings. In the FIG. 2 example, the poly-phase filter 275 includes a first register module R1 configured to output and hold values for the first filtered stream from the phase filter $H_i(Z)$, and a second register module R2 configured to output and hold values for the second filtered stream from the phase filter $H_{i+N}(Z)$. The first register module R1 operates in response to a first clock signal CLOCK_1 and the second register module R2 operates in response to a second clock signal CLOCK_2. The first clock signal and the second clock signal have the same frequency, but different timings. In an example, the timing difference of the first clock signal and the second clock signal is related to the phase difference of the phase filters $H_i(Z)$ and $H_{i+N}(Z)$, such as a half clock cycle (180°).

It is noted that the different output timings can be implemented by other suitable technique. In an example, the first register module R1 and the second register module R2 are configured to operate in response to different edges of a same clock signal. For example, the first register module R1 is configured to output, in response to a rising edge of a clock signal, a value of the first filtered stream from the phase filter $H_i(Z)$, and hold the value until a next rising edge; and the second register module R2 is configured to output, in response to a falling edge of the same clock signal, a value of the second filtered stream from the phase filter $H_{i+N}(Z)$, and hold the value until a next falling edge. Thus, the output timing difference of the first register module R1 and the second register module R2 is a half clock cycle (180°).

Then, the outputs from the first register module R1 and the second register module R2 are added together by the adder 276. When the filtered streams from the phase filters $H_i(Z)$ and $H_{i+N}(Z)$ are output with a half clock cycle timing difference and are added together by the adder 276, the sample rate is doubled. According to an aspect of the disclosure, the two register modules R1 and R2 respectively operate using zero-order hold (ZOH). Because the two register modules R1 and R2 update at different timings, such as with a half clock cycle timing difference, the resulting stream from the adder 276 has a doubled sample rate. In addition, because the two filtered streams have 180° phase difference, the image frequency components due to the non-zero DC level in the two filtered streams can have the same absolute value but opposite signs and thus can be cancelled by adding the two filtered streams together. For example, the sample rate for the input stream is 62.4 MHz, generally, due to the non-zero DC level, up-sampling can cause a spur at 62.4 MHz which is the image frequency component for the DC level. Because the respective image frequency components for the DC level in the two filtered streams have 180° phase difference, when the two filtered streams are added together, the image frequency components due to the non-zero DC level in the input stream can be cancelled.

The amplitude adjustment module 277 is configured to adjust the amplitude of the output stream to the output node 278. In an example, the amplitude adjustment module 277 is configured to perform a division by 2. The output node 278 includes any suitable circuit to provide the output stream to the following processing circuit, such as the CIC filter 280. The CIC filter 280 is configured to further increase the sample rate and filter the output stream based on a cascaded integrator-comb filter topology.

According to an aspect of the disclosure, in the first stage 270, a sample rate for streams in the poly-phase filter 275 is the same as the input stream, such as 62.4 MHz, and a sample rate for the stream after being processed by the adder 276 is doubled, such as 124.8 MHz. In an example, the poly-phase filter 275 operates under a clock signal of 62.4 MHz, and the circuits int eh first stage 270 following the adder 276 operate under a clock signal of 124.8 MHz.

Figure 3:
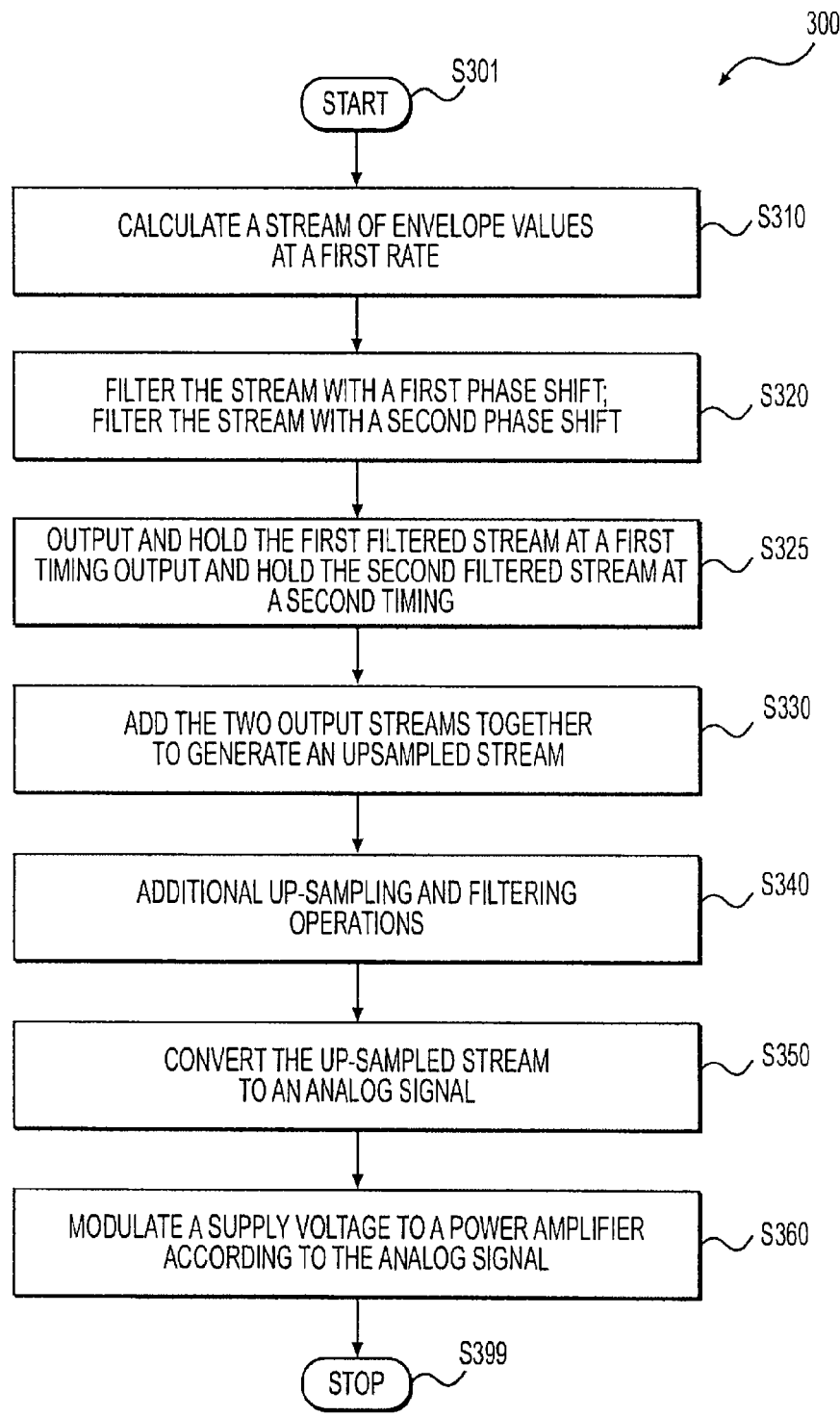
FIG. 3 shows a flow chart outlining a process example 300 according to an embodiment of the disclosure.

FIG. 3 shows a flow chart outlining a process example 300 according to an embodiment of the disclosure. In an embodiment, the process can be executed by the wireless device 100 with the up-sample module 240. The process starts at S301 and proceeds to S310.

At S310, a stream of envelope values for data to transmit is calculated at a first rate. For example, the baseband processing unit 110 calculates an in-phase component (I) and a quadrature component (Q) for the data to transmit, and the envelope calculation unit 105 calculates an envelope value based on the I and Q components. In an example, the baseband processing unit 110 outputs a stream of envelope values at a relatively lower rate, such as 62.4 MHz.

At S320, two filtered streams with different phases are generated based on the stream of envelope values. For example, the two filtered streams are generated by the phase filters $H_i(Z)$ and $H_{i+N}(Z)$ in the FIG. 2 example. The phase filter $H_i(Z)$ is configured to filter and phase-shift the stream of envelope values by a first phase shift, and the phase filter $H_{i+N}(Z)$ is configured to filter and phase-shift the stream of envelope values by a second phase shift. In an example, a phase shift difference between the first phase shift and the second phase shift is 180°.

At S325, the two filtered streams are output at different timings. For example, the first register module R1 is configured to output and hold the first filtered stream from the phase filter $H_i(Z)$ in response to rising edges of a clock signal, and the second register module R2 is configured to output and hold the second filtered stream from the phase filter $H_{i+N}(Z)$ in response to falling edges of the clock signal.

At S330, the two output streams are added together to generate an up-sampled stream. In the FIG. 2 example, the adder 276 adds the output streams from the first register module R1 and the second register module R2. Due to the output timing difference of the two register modules R1 and R2, the sample rate is doubled. Because of the phase shift difference of the two output streams, the image frequency components for the DC level in the two output streams have about the same absolute value but opposite signs, the image frequency component for the DC level in the up-sampled stream can be cancelled or reduced.

At S340, additional up-sampling and filtering operations can be performed. In the FIG. 2 example, the CIC filter 280 further doubles the sample rate and filters the output stream.

At S350, the output stream is converted to an analog signal. In the FIG. 1 example, the DAC 133 converts the up-sampled stream $E_{D\_HIGH}$ to the analog modulation signal $E_A$.

At S360, the analog modulation signal is used to modulate a supply voltage to a power amplifier. In the FIG. 1 example, the analog modulation signal $E_A$ is used to modulate the supply voltage $V_{DD\_MOD}$ to the power amplifier 150. The power amplifier 150 amplifies the RF signal carrying the data for transmission. When the supply voltage modulation by the analog modulation signal $E_A$ is aligned with the RF signal, the power amplifier 150 has a reduced voltage drop, and thus the power amplifier itself consumes a reduced amount of power. Then the process proceeds to S399 and terminates.

FIG. 4A shows a plot 400A of a sinusoidal signal 410. The X-axis is time and Y-axis is the amplitude of the sinusoidal signal 410. The sinusoidal signal 410 has a zero DC level.

FIG. 4B shows a plot 400B of an envelope signal 420 for the sinusoidal signal 410. The X-axis is time and Y-axis is the amplitude of the envelope signal 420. The envelope signal 420 has a non-zero DC level.

FIG. 4C shows a plot 400C of frequency spectrums for a signal and an envelope signal of the signal. The X-axis is frequency and the Y-axis is amplitude. The plot 400C includes a first curve 440 for the frequency spectrum of the signal, and a second curve 430 for the frequency spectrum of the envelope signal. The bandwidth of the envelope signal is about twice of the bandwidth of the signal. In addition, the envelope signal has a relatively large DC level, as shown by 445. The large DC level can cause spurs at image frequencies when the envelope signal is up-sampled.

Figure 5:
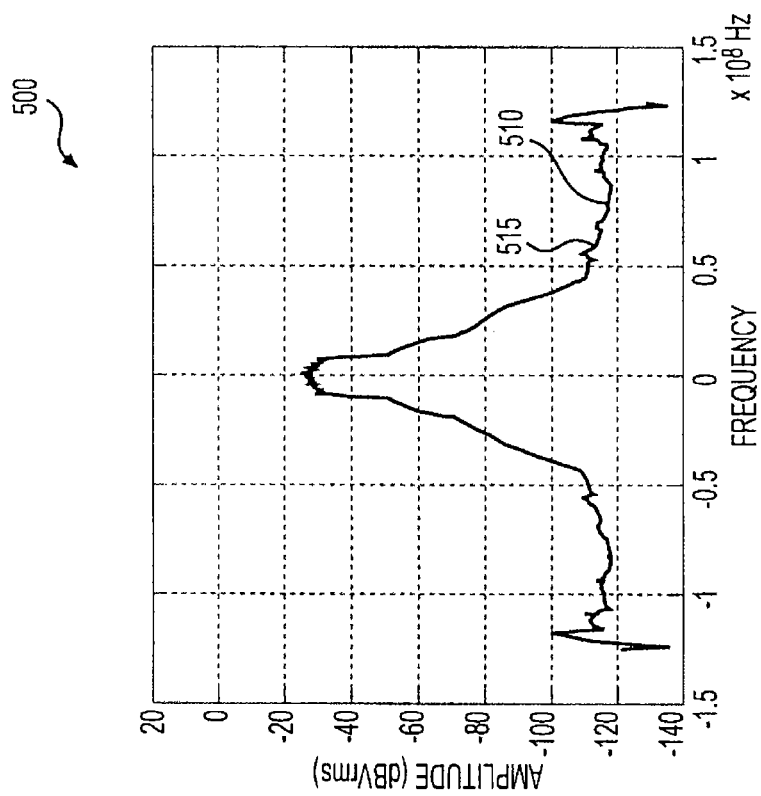
FIG. 5 show a plot of frequency spectrum according to an embodiment of the disclosure.

FIG. 5 shows a plot 500 of a frequency spectrum 510 for an output stream from the output node 278 in the FIG. 2 example. The X-axis is frequency and the Y-axis is amplitude. In the FIG. 2 example, the spur reduction function is implemented based on the existing phase filter 275 with the additional adder 276. The implementation in FIG. 2 can achieve over 50 dB spur attenuation. In the FIG. 5 example, the frequency spectrum 510 does not have a significant spur at the image frequency for the DC level due to the up-sampling, such as at 62.4 MHz, as shown by 515.

Figure 6:
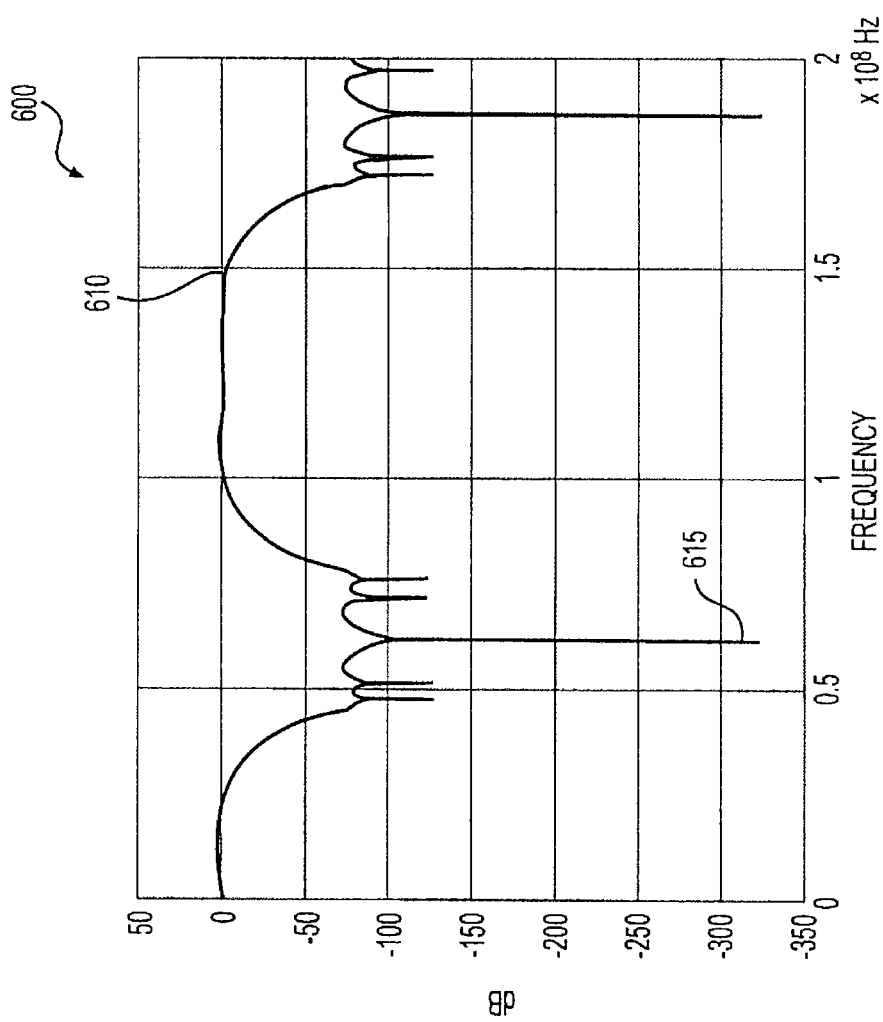
FIG. 6 shows a plot of transfer function according to an embodiment of the disclosure.

FIG. 6 shows a plot 600 of a transfer function 610 for the first stage 270 that is based on a poly-phase filter. The transfer function 610 represents the response of the first stage 270 to the stimulus in terms of temporal frequency. The transfer function 610 has a trench characteristic at an image frequency, such as 62.4 MHz, as shown by 615. The trench characteristic reduces the spur level at the image frequency.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A circuit comprising:
a first circuit configured to generate a first signal by outputting and holding, at a first timing, a first stream in response to an input stream of envelope values for a transmission signal;
a second circuit configured to generate a second signal by outputting and holding, at a second timing, a second stream in response to the input stream of data; and
an adder configured to add the first signal with the second signal to generate an up-sampled stream for the input stream and reduce a frequency component in the up-sampled stream generated by the up-sampling.

2. The circuit of claim 1, wherein:
the first circuit is configured to generate the first stream with a first phase shift to the input stream; and
the second circuit is configured to generate the second stream with a second phase shift to the input stream.

3. The circuit of claim 2, wherein the second circuit is configured to generate the second stream with an additional 180° phase shift to the first phase shift.

4. The circuit of claim 1, wherein
the first circuit is configured to generate the first signal by outputting and holding, at rising edges of a clock signal, the first stream in response to the input stream; and
the second circuit is configured to generate the second signal by outputting and holding, at falling edges of the clock signal, the second stream in response to the input stream.

5. The circuit of claim 1, wherein the up-sampled stream is used to generate an output signal to modulate a supply voltage to a power amplifier that amplifies the transmission signal.

6. The circuit of claim 5, wherein
a third circuit is configured to generate the transmission signal in a radio frequency band.

7. The circuit of claim 6, further comprising:
a plurality of circuits configured to phase-shift the input stream by different phases, wherein the first circuit and second circuit are selected from the plurality of circuits to align the supply voltage adjustment with the generation of the transmission signal.

8. A method comprising:
generating a first signal by outputting and holding, at a first timing, a first stream in response to an input stream of envelope values for a transmission signal;
generating a second signal by outputting and holding, at a second timing, a second stream in response to the input stream; and
adding the first signal with the second signal to generate an up-sampled stream for the input stream and reduce a frequency component in the up-sampled stream that is generated by the up-sampling.

9. The method of claim 8, wherein generating the first signal and the second signal further comprises:
generating the first stream with a first phase shift to the input stream; and
generating the second stream with a second phase shift to the input stream.

10. The method of claim 9, wherein generating the second stream further comprises:
generating the second stream with an additional 180° phase shift to the first phase shift.

11. The method of claim 8, wherein generating the first signal and the second signal further comprises:
generating the first signal by outputting and holding, at rising edges of a clock signal, the first stream in response to the input stream; and
generating the second signal by outputting and holding, at falling edges of the clock signal, the second stream in response to the input stream.

12. The method of claim 8, further comprising:
modulating a supply voltage to a power amplifier that amplifies the transmission signal.

13. The method of claim 12, wherein
generating the transmission signal in a radio frequency band.

14. The method of claim 13, further comprising:
generating the first stream with a first phase shift that is determined to align the supply voltage adjustment with the generation of the transmission signal.

15. An apparatus comprising:
an envelope processing circuit that includes:
- a first circuit configured to generate a first signal by outputting and holding, at a first timing, a first stream in response to an input stream of envelopes values for a transmission signal;
- a second circuit configured to generate a second signal by outputting and holding, at a second timing, a second stream in response to the input stream; and
- an adder configured to add the first signal with the second signal to generate an up-sampled stream for the input stream and reduce a frequency component in the up-sampled stream generated by the up-sampling; and a voltage modulator configured to modulate a supply voltage to an amplifier that amplifies the transmission signal based on the up-sampled stream.

16. The apparatus of claim 15, wherein:
the first circuit is configured to generate the first stream with a first phase shift to the input stream; and
the second circuit is configured to generate the second stream with a second phase shift to the input stream.

17. The apparatus of claim 16, wherein the second circuit is configured to generate the second stream with an additional 180° phase shift to the first phase shift.

18. The apparatus of claim 15, wherein
the first circuit is configured to generate the first signal by outputting and holding, at rising edges of a clock signal, the first stream in response to the input stream; and
the second circuit is configured to generate the second signal by outputting and holding, at falling edges of the clock signal, the second stream in response to the input stream.

19. The apparatus of claim 15, wherein
a third circuit is configured to generate the transmission signal in a radio frequency band.

20. The apparatus of claim 19, further comprising:
a plurality of circuits configured to phase-shift the input stream by different phases, wherein the first circuit and second circuit are selected from the plurality of circuits to align the supply voltage adjustment with the generation of the transmission signal.

* * * * *